United States Patent
Yen et al.

(10) Patent No.: US 11,664,301 B2
(45) Date of Patent: May 30, 2023

(54) SEMICONDUCTOR DEVICE PACKAGE

(71) Applicant: Advanced Semiconductor Engineering, Inc., Kaohsiung (TW)

(72) Inventors: You-Lung Yen, Kaohsiung (TW); Bernd Karl Appelt, Holly Springs, NC (US)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 43 days.

(21) Appl. No.: 17/205,967

(22) Filed: Mar. 18, 2021

(65) Prior Publication Data

US 2022/0302004 A1  Sep. 22, 2022

(51) Int. Cl.
*H01L 23/498* (2006.01)
*H01L 21/48* (2006.01)

(52) U.S. Cl.
CPC .... *H01L 23/49822* (2013.01); *H01L 21/4853* (2013.01); *H01L 21/4857* (2013.01); *H01L 23/49816* (2013.01); *H01L 23/49827* (2013.01)

(58) Field of Classification Search
CPC ........... H01L 23/49822; H01L 21/4853; H01L 21/4857; H01L 23/49816; H01L 23/49827
See application file for complete search history.

(56) References Cited

U.S. PATENT DOCUMENTS

| | | | |
|---|---|---|---|
| 2013/0026599 A1* | 1/2013 | Nakamura | H01L 24/14 257/508 |
| 2018/0286751 A1* | 10/2018 | Wietstruck | H01L 21/78 |
| 2021/0305162 A1* | 9/2021 | Ganesan | H01L 21/6835 |
| 2022/0093543 A1* | 3/2022 | Seo | H01L 25/0652 |
| 2022/0230939 A1* | 7/2022 | Shih | H01L 21/76832 |
| 2022/0231067 A1* | 7/2022 | Huang | H01L 27/1464 |

\* cited by examiner

*Primary Examiner* — Selim U Ahmed
*Assistant Examiner* — Evan G Clinton
(74) *Attorney, Agent, or Firm* — Foley & Lardner LLP

(57) ABSTRACT

The present disclosure provides a semiconductor device package. The semiconductor device package includes a substrate having a first surface and a second surface opposite to the first surface of the substrate. The substrate has a through opening extending between the first surface of the substrate and the second surface of the substrate. The semiconductor device package also includes a conductive pad in the through opening and approximal to the second surface of the substrate. The conductive pad has a first surface and a second surface opposite to the first surface of the conductive pad. The semiconductor device package also includes a conductive pillar in contact with the first surface of the conductive pad. The second surface of the conductive pad protrudes from the second surface of the substrate. A method of manufacturing a semiconductor device package is also disclosed.

20 Claims, 24 Drawing Sheets

SEMICONDUCTOR DEVICE PACKAGE

BACKGROUND

1. Technical Field

The present disclosure generally relates to a semiconductor device package and a method of manufacturing the same, and to a semiconductor device package including a conductive pillar and a conductive pad.

2. Description of the Related Art

Through-silicon vias (TSV) are commonly used as interconnections in 2.5D or 3D IC packaging to facilitate electrical interconnection or signal transmission by virtue of a shorter electrical connection path, lower resistance/inductance, and a more efficient transmission of signals and power as compared to the wire bonding counterpart.

However, dimples or recesses on top of a TSV structure after TSV filling may cause processing difficulties in subsequent 3D IC stacking; for example, with wire bonding, there is difficulty in landing on a dimpled or recessed surface, which prevents the lower die(s) of the interconnection architecture from transmitting signals among the upper die(s).

Moreover, for TSV with a high aspect ratio, voids may be generated therein if the plating current density is not well-controlled, which may increase cost and decrease throughput.

SUMMARY

In one or more embodiments, a semiconductor device package includes a substrate having a first surface and a second surface opposite to the first surface of the substrate. The substrate has a through opening extending between the first surface of the substrate and the second surface of the substrate. The semiconductor device package also includes a conductive pad in the through opening and approximal to the second surface of the substrate. The conductive pad has a first surface and a second surface opposite to the first surface of the conductive pad. The semiconductor device package also includes a conductive pillar in contact with the first surface of the conductive pad. The second surface of the conductive pad protrudes from the second surface of the substrate.

In one or more embodiments, a semiconductor device package includes a carrier body having a first surface and a second surface opposite to the first surface of the carrier body. The carrier body has a through opening extending between the first surface of the carrier body and the second surface of the carrier body. The semiconductor device package also includes a conductive pillar in the through opening of the carrier body. The semiconductor device package also includes a leveled pad within the through opening of the carrier body and in contact with the conductive pillar. The conductive pillar is composed of a material different from that of the leveled pad. The leveled pad is an etch protection layer to the conductive pillar.

In one or more embodiments, a method for manufacturing a semiconductor device package includes patterning an etch stop pad over a temporary carrier, forming a conductive pillar on the etch stop pad, attaching a carrier body to the temporary carrier by aligning a through opening of the carrier body to the conductive pillar, and removing the temporary carrier by etching a conductive foil layer and exposing the etch stop pad.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
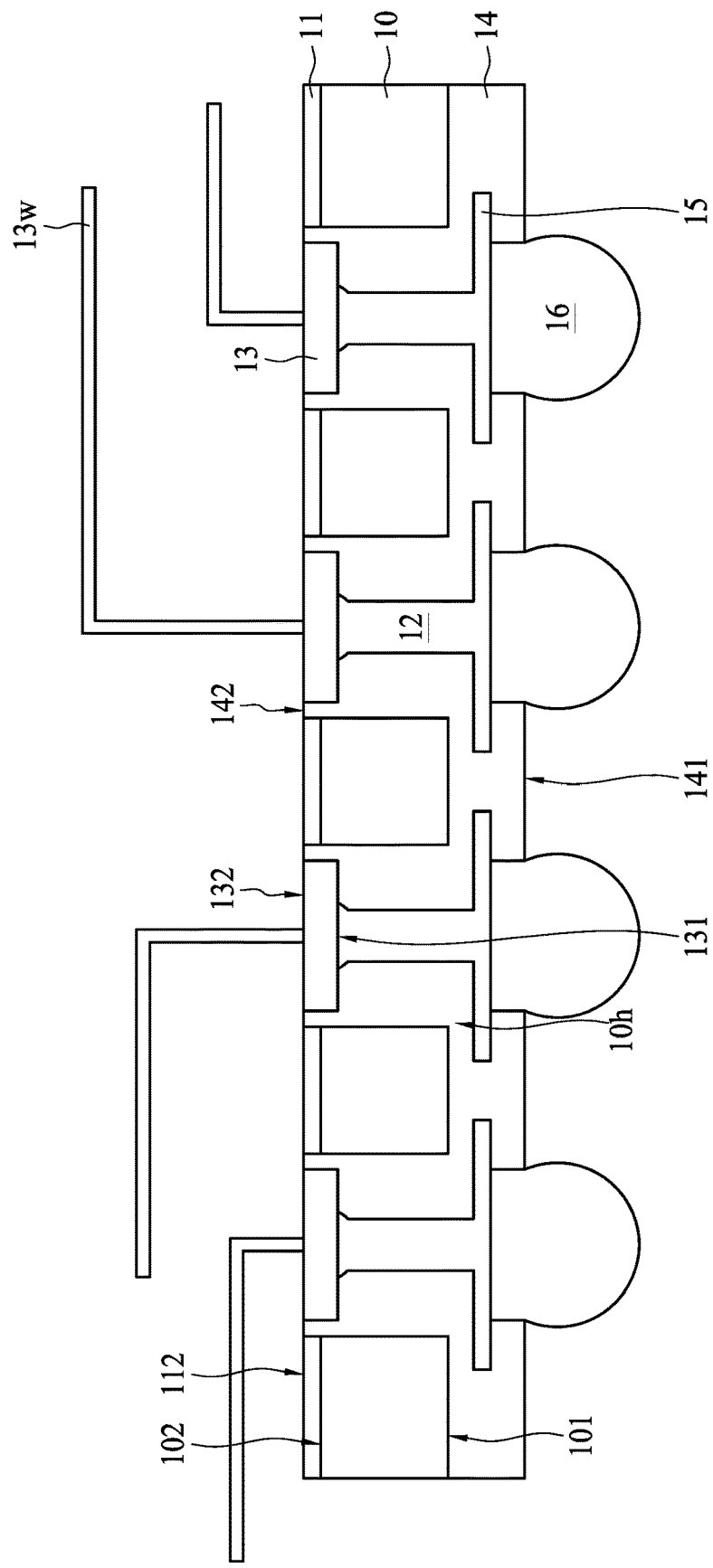
FIG. 1A illustrates a cross-sectional view of a semiconductor device package in accordance with some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity, and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1A illustrates a cross-sectional view of a semiconductor device package 1 in accordance with some embodiments of the present disclosure. The semiconductor device package 1 includes a substrate 10, dielectric layers 11 and 14, a conductive pillar 12, a conductive pad 13, a redistribution layer (RDL) 15, and an electrical contact 16.

The substrate 10 has a surface 101 and a surface 102 opposite to the surface 101. In some embodiments, the substrate 10 may include, for example, but is not limited to, a printed circuit board, such as a paper-based copper foil laminate, a composite copper foil laminate, or a polymer-impregnated glass-fiber-based copper foil laminate. In some embodiments, the substrate 10 may include one or more interconnection structures, such as conductive traces, through vias, redistribution layers (RDLs) or grounding elements. In some embodiments, the substrate 10 may include a wafer, such as a semiconductor wafer. In some embodiments, the substrate 10 may include interposer-like wirings to form a structure which may be regarded as an interposer or a fan-out substrate.

The conductive pillar 12 may penetrate the substrate 10. The conductive pillar 12 may extend between the surface 101 and the surface 102 of the substrate 10. The conductive pillar 12 may be in a through opening 10h of the substrate 10 that extends between the surface 101 and the surface 102 of the substrate 10. The conductive pillar 12 may be surrounded by the substrate 10. The conductive pillar 12 may be spaced apart from the sidewall of the through opening 10h of the substrate 10. The conductive pillar 12 may be not in contact with the sidewall of the through opening 10h of the substrate 10.

In some embodiments, the conductive pillar 12 may include, for example, but is not limited to, gold (Au), silver (Ag), copper (Cu), nickel (Ni), palladium (Pd), another metal, a solder alloy, or a combination of two or more thereof. In some embodiments, the conductive pillar 12 may include a Cu pillar. In some embodiments, the conductive pillar 12 may include a stud bump where a width measured proximal to the conductive pad 13 being wider than a width measured proximal to the first surface 101 of the substrate 10. A convex bulge profile may be observed at the end of the stud bump proximal to the conductive pad 13.

The conductive pad 13 may have a surface 131 facing the conductive pillar 12 and a surface 132 opposite to the surface 131. The surface 131 of the conductive pad 13 may be in direct contact with the conductive pillar 12. The surface 132 of the conductive pad 13 may be connected with an external component, such as a conductive wire 13w (or a solder ball, or another connector) to provide electrical interconnection or signal transmission for the semiconductor device package 1 with an external component (e.g. external circuits or circuit boards). For example, the conductive pillar 12 may be connected with an external component through the conductive pad 13 and the conductive wire 13w. For example, the conductive pad 13 may include a wire-bondable pad. The conductive pad 13 may possess suitable dimension and material that allows a wedge bond or a wire bond to be formed thereon.

The surface 131 of the conductive pad 13 may be at a different elevation with respect to the surface 102 of the substrate 10. The surface 131 of the conductive pad 13 and the surface 102 of the substrate 10 may not be aligned. In other words, the interface between the conductive pillar 12 and the conductive pad 13 may be at a different elevation with respect to the surface 102 of the substrate 10. The interface between the conductive pillar 12 and the conductive pad 13 may be between the opposite surfaces (i.e., surface 101 and the surface 102) of the substrate 10.

The surface 132 of the conductive pad 13 may be at a different elevation with respect to the surface 102 of the substrate 10 by virtue of a bonding layer at the surface 102 of the substrate 10. In some embodiments, the bonding layer can be a dielectric layer 11, for example, polyimide. As shown in FIG. 1A, the surface 132 of the conductive pad 13 is substantially coplanar with the surface 112 of the dielectric layer 11, and thus is at a higher than the surface 102 of the substrate 10. Alternatively stated, conductive pad 13 is accommodated in the opening 10h of the substrate 10 and the surface 132 of the conductive pad 13 protrudes from the surface 102 of the substrate 10.

The conductive pad 13 may cover a side of the conductive pillar 12 such that the conductive pillar 12 may not be exposed from the surface 102 of the substrate 10. In comparison with the conductive pillar 12, the conductive pad 13 may be closer to the outermost surface (such as a surface 112 of the dielectric layer 11) of the structure in FIG. 1A.

In some embodiments, the conductive pad 13 may include, for example, but is not limited to Au, Ag, Cu, Ni, Pd, another metal, a solder alloy, or a combination of two or more thereof. In some embodiments, the conductive pad 13 may have an Au pad or Au coating. In some embodiments, the conductive pad 13 may have an Au/Ni/Au pad or Au/Ni/Au coating. In some embodiments, the conductive pad 13 and the conductive pillar 12 may have the same material. In some embodiments, the conductive pad 13 and the conductive pillar 12 may have different materials.

In some embodiments, the etching selectivity of the conductive pad 13 may be different from the etching selectivity of the conductive pillar 12 with respect to a predetermined etchant. In some embodiments, the conductive pad 13 may protect the conductive pillar 12 from being removed or etched away (such as in the operation in FIG. 6F to remove a carrier and a Cu foil).

The dielectric layer 11 may be disposed on the surface 102 of the substrate 10. The dielectric layer 11 may directly contact the surface 102 of the substrate 10. The dielectric layer 11 and the substrate 10 may together form the through opening 10h that surrounding the conductive pillar 12 and the conductive pad 13.

In some embodiments, the dielectric layer 11 may include, for example, but is not limited to, one or more organic materials (e.g., a molding compound, bismaleimide triazine (BT), a polyamide (PA), a polyimide (PI), a polybenzoxazole (PBO), a solder resist, an Ajinomoto build-up film (ABF), an epoxy, an epoxy-based material, or a combination of two or more thereof), inorganic materials (e.g., silicon, a glass, a ceramic, a quartz, or a combination of two or more thereof), liquid-film material(s) or dry-film material(s), or a combination of two or more thereof.

The dielectric layer 14 may dispose in the through opening 10h of the substrate 10. The dielectric layer 14 may dispose on the surface 101 of the substrate 10 and extend into the through opening 10h of the substrate 10. The dielectric layer 14 may cover the surface 101 of the substrate 10. The dielectric layer 14 may be in direct contact with the surface 101 of the substrate 10.

The dielectric layer 14 may surround the conductive pillar 12. The dielectric layer 14 may fill up the gap between the conductive pillar 12 and the substrate 10. The dielectric layer 14 may dispose between the conductive pillar 12 and the substrate 10. The dielectric layer 14 may be in direct contact with the conductive pillar 12. The dielectric layer 14 may be in direct contact with the sidewall of the through opening 10h of the substrate 10. In some embodiments, there may be no seed layer on the sidewall of the through opening 10h of the substrate 10.

The dielectric layer 14 may surround the conductive pad 13. The dielectric layer 14 may fill up the gap between the conductive pad 13 and the substrate 10. The dielectric layer 14 may dispose between the conductive pad 13 and the substrate 10. The dielectric layer 14 may be in direct contact with the conductive pad 13.

The dielectric layer 14 may surround the dielectric layer 11. The dielectric layer 14 may fill up the gap between the conductive pad 13 (and/or the conductive pillar 12) and the dielectric layer 11. The dielectric layer 14 may dispose between the conductive pad 13 (and/or the conductive pillar 12) and the dielectric layer 11. The dielectric layer 14 may be in direct contact with the dielectric layer 11.

The dielectric layer 14 may have a surface 141 and a surface 142 opposite to the surface 141. The surface 142 of the dielectric layer 14 may be substantially coplanar with the surface 132 of the conductive pad 13. The surface 142 of the dielectric layer 14 may be substantially coplanar with the surface 112 of the dielectric layer 11. In some embodiments, the conductive pad 13 may have a leveled or flat surface for forming the conductive wire 13w.

In some embodiments, the dielectric layer 14 may have a material as listed above for the dielectric layer 11. In some embodiments, the dielectric layer 14 and the dielectric layer 11 may have the same material. In some embodiments, the dielectric layer 14 and the dielectric layer 11 may have different materials. In some embodiments, although there is an interface between the dielectric layer 14 and the dielectric layer 11 in FIG. 1A, the interface may be unobservable or not existed. For example, the dielectric layer 14 may also cover the surface 112 of the substrate 10.

The RDL 15 may be disposed over the surface 101 of the substrate 10. The RDL 15 may be electrically connected to the conductive pillar 12 to provide electrical interconnection or signal transmission for the semiconductor device package 1 with an external component (e.g. external circuits or circuit boards). The electrical contact 16 may be disposed on the surface 141 of the dielectric layer 14 and electrically connected to the RDL 15. For example, the conductive pillar 12 may be connected with an external component through the RDL 15 and the electrical contact 16.

In some embodiments, the electrical contact 16 may include a controlled collapse chip connection (C4) bump, a ball grid array (BGA), or a land grid array (LGA). In some embodiments, the electrical contact 16 may include a flowable conductive material. In some embodiments, the electrical contact 16 may include, for example, eutectic Sn/Pb, high-lead solder, lead-free solder, pure tin solder, or other types of solders.

In some embodiments, the conductive pillar 12 may be connected between a lower external component and an upper external component. For example, the conductive pillar 12 may be connected between an external component over the surface 101 of the substrate 10 and an external component over the surface 102 of the substrate 10.

In some embodiments, in an exemplary method for manufacturing the semiconductor device package 1, the conductive pad 13 is formed on a temporary carrier; next, the conductive pillar 12 is formed on the conductive pad 13. After the temporary carrier is removed, a wire bonding operation may be conducted on a level and flat surface (such as the surface 132) of the conductive pad 13. The conductive pillar 12 may be connected between a lower external component and an upper external component, which helps to increase flexibility in the interconnection path design. As such, the lower component(s) (such as die(s)) of the interconnection architecture can transmit signals among the upper component(s) by the greatly improved wire bonding environment.

In addition, in some exemplary methods, in addition to or as an alternative to the aforesaid exemplary method, the conductive pillar 12 is plated over the conductive pad 13. Subsequently, pre-formed through opening 10h on the substrate 10 are aligned with the conductive pillar 12 and stacked over the temporary carrier. Next, a dielectric (such as the dielectric layer 14) is filled into the remaining space of the through opening 10h. The conductive pillar 12 may or may not be formed by Cu plating. Nevertheless, the conductive pad 13 where the conductive pillar 12 lands upon provides a substantially flat platform without dimple or recess (as previously observed in TSV), which is suitable for subsequent interconnection manufacturing coupled from said flat platform. In some embodiments, the conductive pad 13 can be a wire-bondable pad.

Figure 1B:
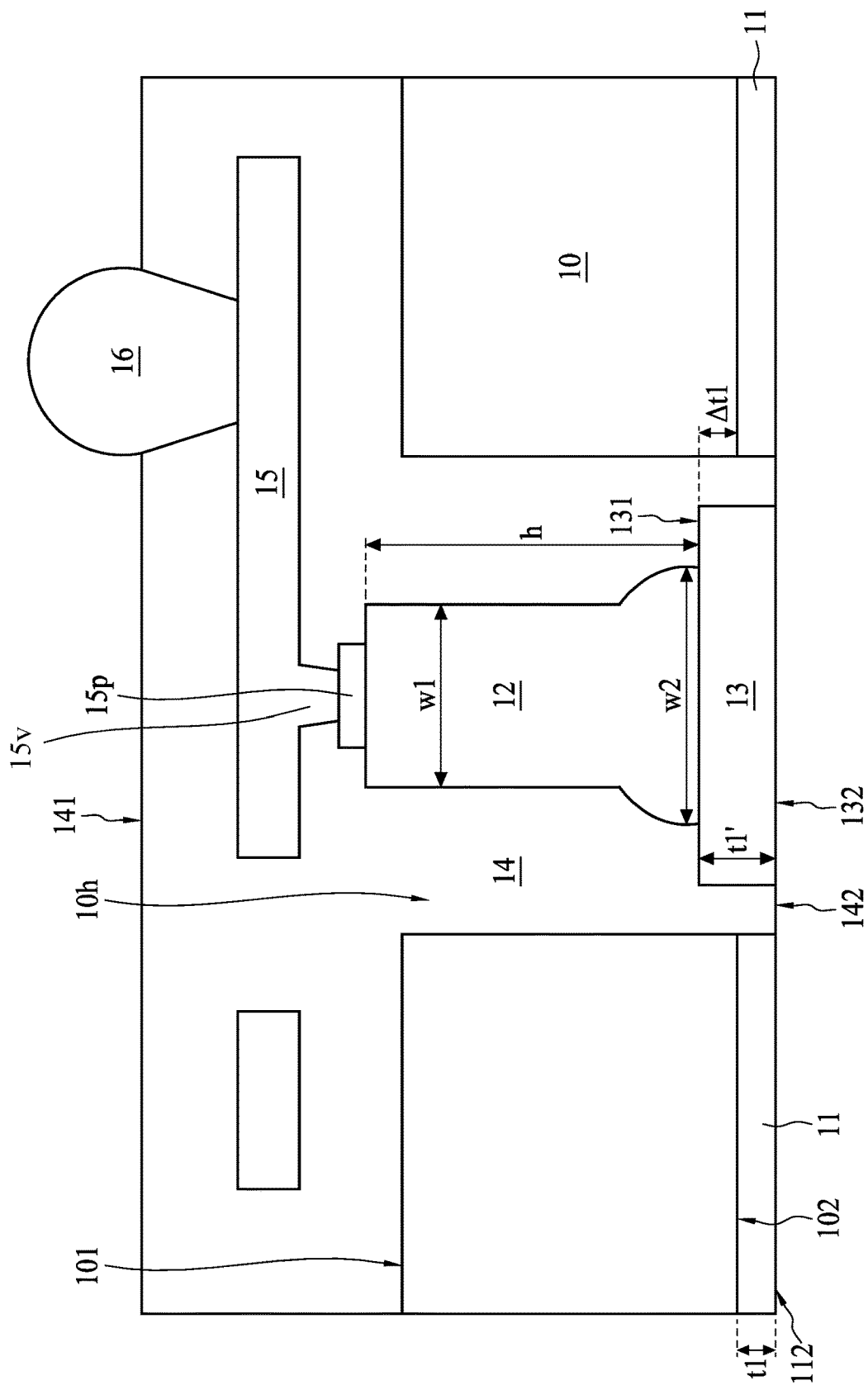
FIG. 1B illustrates an enlarged view of a portion of a semiconductor device package in accordance with some embodiments of the present disclosure.

FIG. 1B illustrates an enlarged view of a portion 1' of a semiconductor device package in accordance with some embodiments of the present disclosure. In some embodiments, the portion 1' may be a part of the semiconductor device package 1 in FIG. 1A.

As shown in FIG. 1B, a dimension (such as a thickness) t1 of the dielectric layer 11 may be different from a dimension (such as a thickness) t1' of the conductive pad 13. In some embodiments, the dimension t1 may be smaller than the dimension t1'. In some embodiments, the dimension t1' may be smaller than the dimension t1. In some embodiments, the dimension t1 may be greater than the dimension t1'. In some embodiments, the dimension t1' may be greater than the dimension t1. In some embodiments, the surface 131 of the conductive pad 13 may be spaced apart from a surface (which contacting the surface 102 of the substrate 10) of the dielectric layer 11 by a gap $\Delta$ t1. In some embodiments, the gap $\Delta$ t1 may be greater than zero.

In some embodiments, as mentioned, the surface 132 of the conductive pad 13 may be coplanar with the surface 112 of the dielectric layer 11. Therefore, the conductive pillar 12 is raised or lifted by the conductive pad 13 to a higher position than the dielectric layer 11.

As shown in FIG. 1B, a dimension (such as a width or a diameter) w1 of the conductive pillar 12 that proximal to the surface 101 of the substrate 10 may be different from a dimension (such as a width or a diameter) w2 of the conductive pillar 12 that proximal to the surface 102 of the substrate 10. In some embodiments, the dimension w1 may be equal to the dimension w2. In some embodiments, the dimension w1 may be smaller than the dimension w2. In some embodiments, the dimension w2 may be smaller than the dimension w1. In some embodiments, the dimension w1 may be greater than the dimension w2. In some embodiments, the dimension w2 may be greater than the dimension w1.

In some embodiments, each of the dimension w1 and the dimension w2 may be greater than or equal to about 20.0 micrometer (μm), greater than or equal to about 30.0 μm, greater than or equal to about 50.0 μm, or even more. In some embodiments, a dimension (such as a height) h of the conductive pillar 12 may range between about 200.0 μm and about 300.0 μm.

In some embodiments, the RDL 15 may be electrically connected to the conductive pillar 12 through a via 15v and a pad 15p.

Figure 1C:
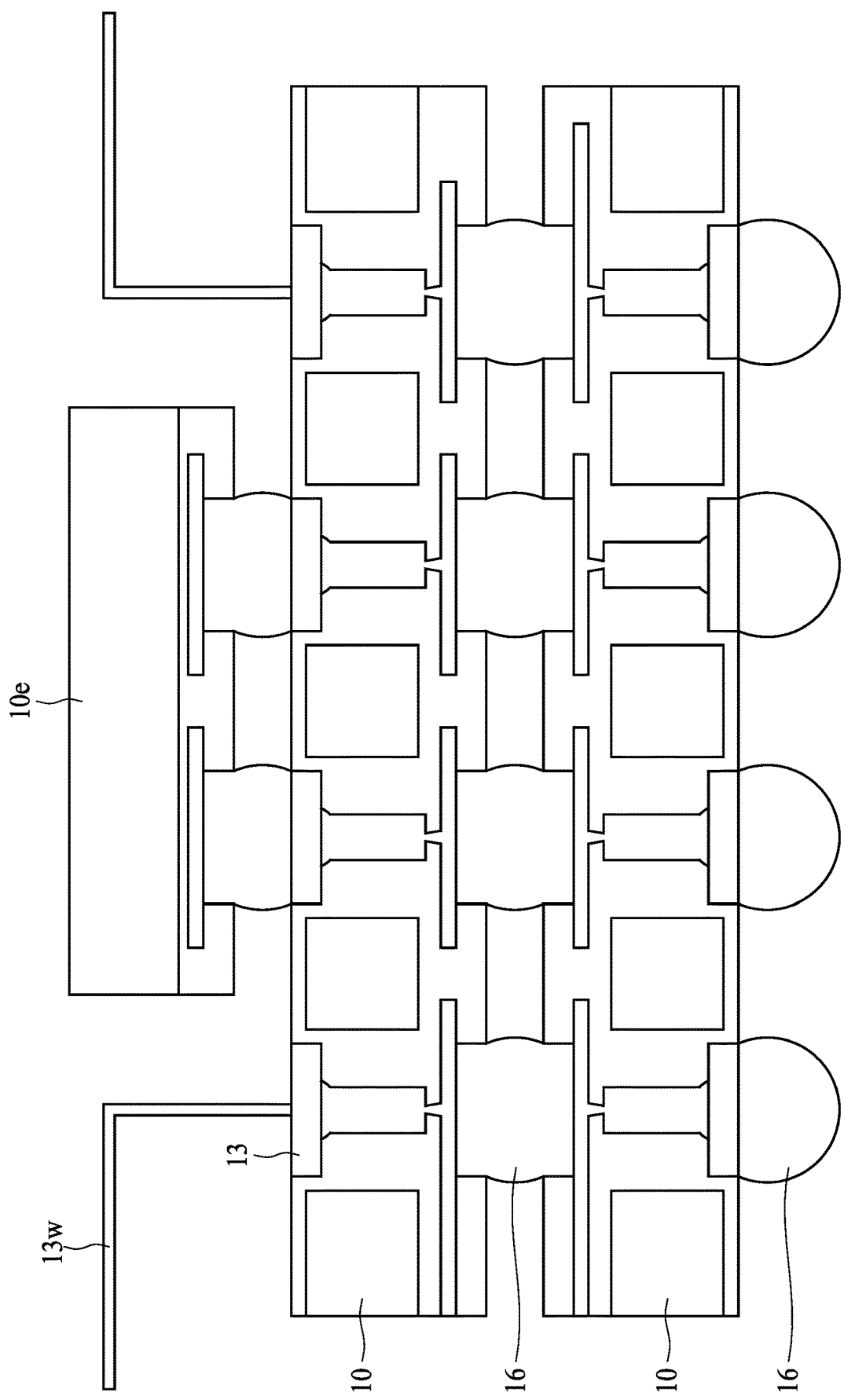
FIG. 1C illustrates an enlarged view of a semiconductor device package in accordance with some embodiments of the present disclosure.

FIG. 1C illustrates a cross-sectional view of a semiconductor device package in accordance with some embodiments of the present disclosure. The semiconductor device package in FIG. 1C includes one substrate 10 stacking on another substrate 10 and an electronic component 10e. The two substrates 10 may be electrically connected through the electrical contact 16. There may be one or more electrical contacts 16 disposed on two sides of the lower substrate 10. The electronic component 10e may be disposed on the conductive pad 13 of the upper substrate 10. In addition, the conductive wire 13w may be formed on the conductive pad 13 of the upper substrate 10. In some embodiments, since the conductive pad 13 has a flat surface, and the substrate 10 can be connected through two sides thereof, it is more flexible to design the arrangements of the connections of a semiconductor device package as shown in FIG. 1C. For example, there may be any number of layers of the substrates 10 in the semiconductor device package. In addition, in some other embodiments, there may be any number of the electronic component 10e (including an active electronic component and/or a passive electronic component) in the semiconductor device package.

Figure 2:
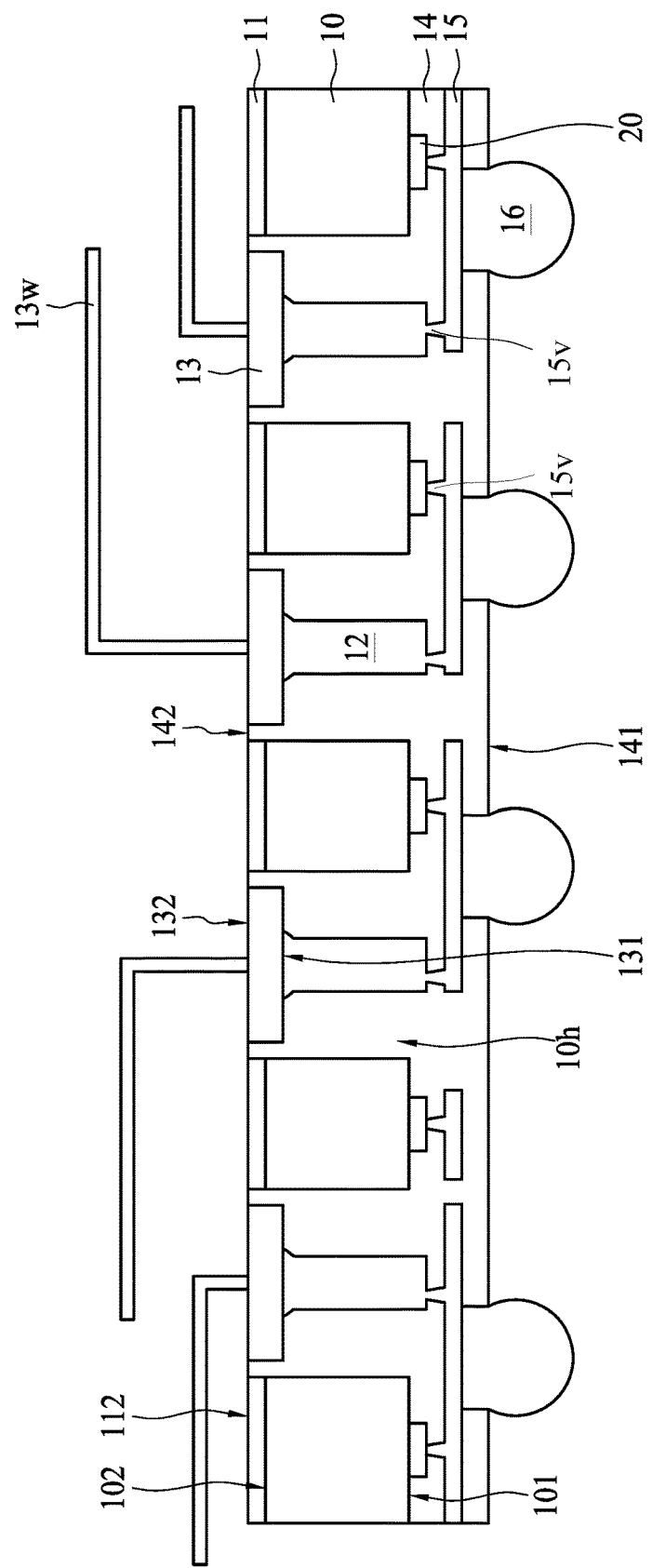
FIG. 2 illustrates a cross-sectional view of a semiconductor device package in accordance with some embodiments of the present disclosure.

FIG. 2 illustrates a cross-sectional view of a semiconductor device package 2 in accordance with some embodiments of the present disclosure. The semiconductor device package 2 is similar to the semiconductor device package 1 in FIG. 1A except for the differences described below.

The substrate 10 may have an active region proximal to the surface 101 of the substrate 10. In other words, the surface 101 of the substrate 10 may include an active surface. A conductive pad 20 may be provided on the surface 101 of the substrate 10. The conductive pad 20 may provide electrical connections between external components and an active region in the substrate 10

The conductive pad 20 may be covered by the dielectric layer 14. A part of the conductive pad 20 may be exposed from the dielectric layer 14 and electrically connected to the RDL 15 through the conductive via 15v. The conductive pillar 12 may be electrically connected to the RDL 15 through the conductive via 15v.

Figure 3:
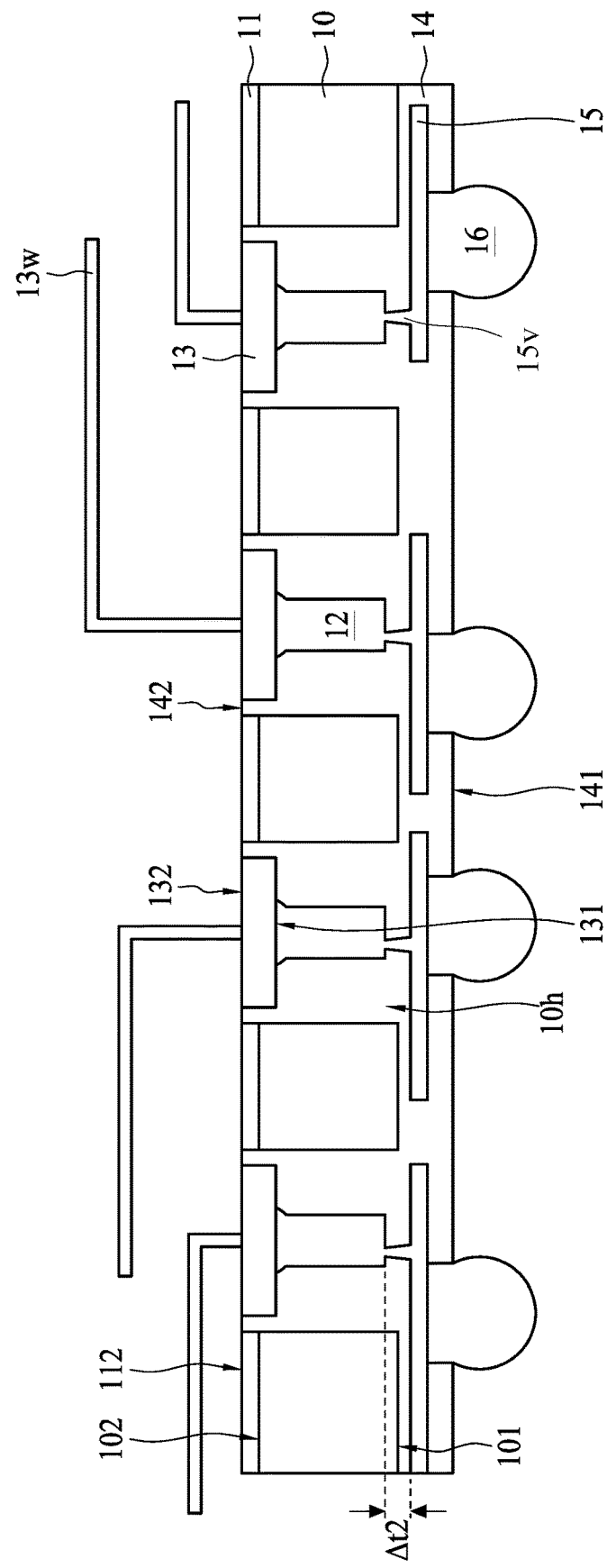
FIG. 3 illustrates a cross-sectional view of a semiconductor device package in accordance with some embodiments of the present disclosure.

FIG. 3 illustrates a cross-sectional view of a semiconductor device package 3 in accordance with some embodiments of the present disclosure. The semiconductor device package 3 is similar to the semiconductor device package 1 in FIG. 1A except for the differences described below.

A surface of the conductive pillar 12 may be recessed from the surface 101 of the substrate 10 by a gap Δ t2. In some embodiments, the gap Δ t2 may be greater than zero. The conductive pillar 12 may be electrically connected to the RDL 15 through the conductive via 15v. In some embodiments, as illustrated in FIG. 7B, recess formation in the dielectric layer 14 can be conducted by laser drilling. In some embodiments, the conductive pillar 12 may be protected by the dielectric layer 14.

In some embodiments, the RDL 15 may be electrically connected to the conductive pillar 12 through a via 15v and a pad 15p as shown in FIG. 1B.

Figure 4:
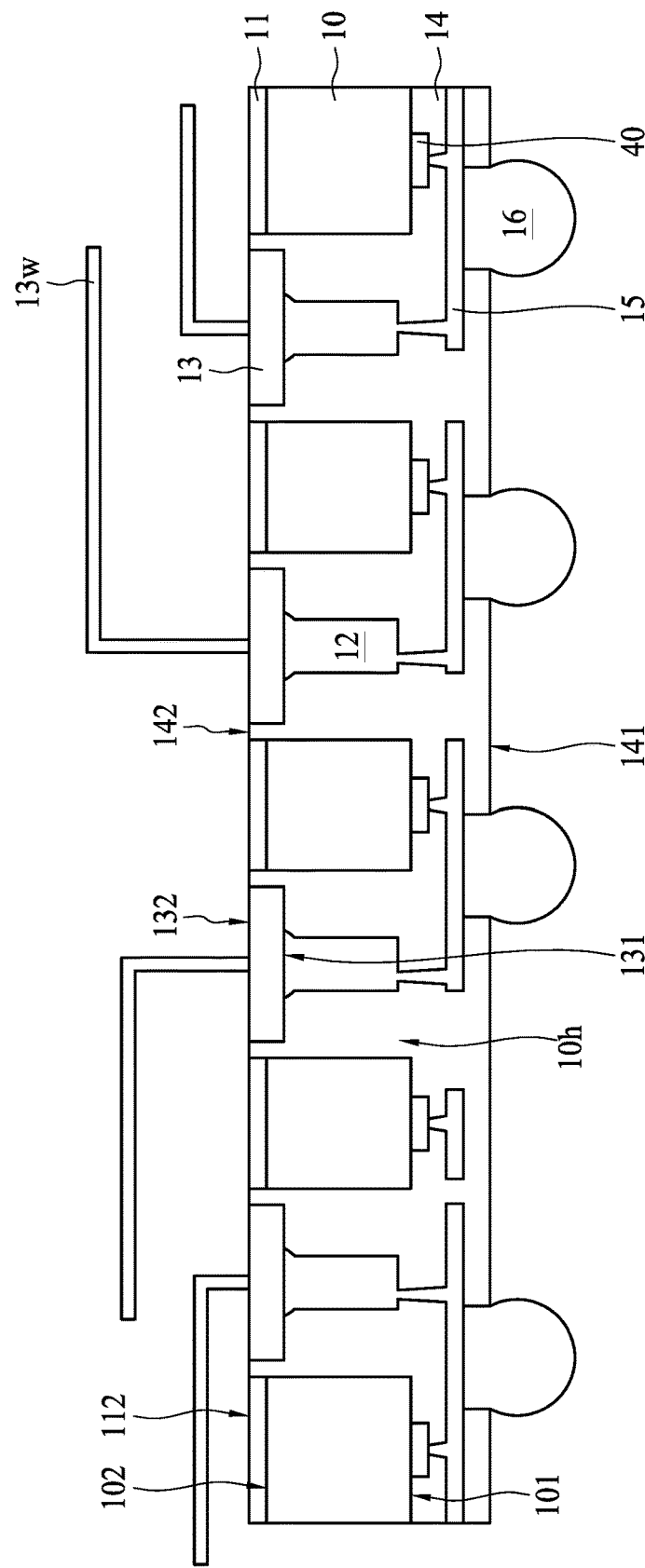
FIG. 4 illustrates a cross-sectional view of a semiconductor device package in accordance with some embodiments of the present disclosure.

FIG. 4 illustrates a cross-sectional view of a semiconductor device package 4 in accordance with some embodiments of the present disclosure. The semiconductor device package 4 is similar to the semiconductor device package 3 in FIG. 3 except for the differences described below.

The substrate 10 may have an active region proximal to the surface 101 of the substrate 10. In other words, the surface 101 of the substrate 10 may include an active surface. An electrical connector 40 may be provided on the surface 101 of the substrate 10 to provide electrical connections between an external component to an active region of the substrate 10. The detailed descriptions of the electrical connector 40 may be referred to the conductive pad 20 stated above and thus, they would not be repeated herein.

Figure 5:
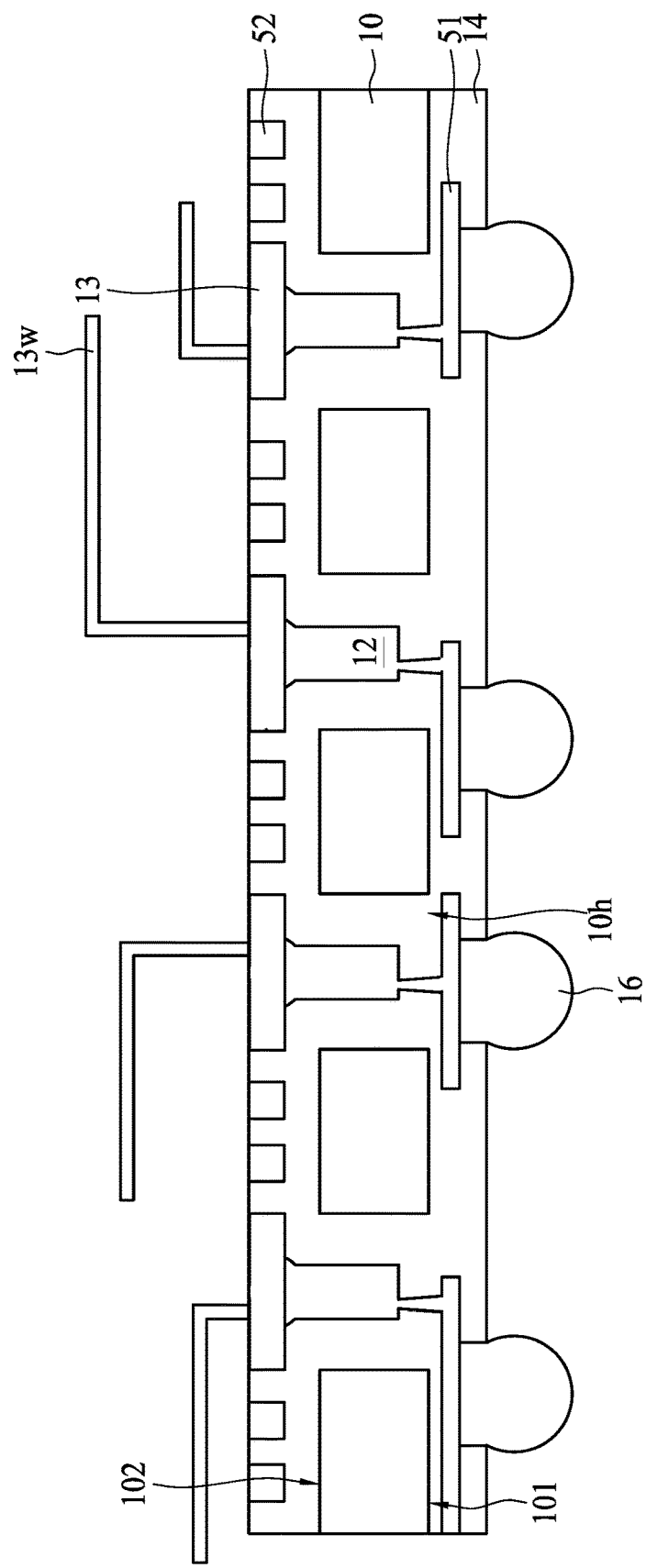
FIG. 5 illustrates a cross-sectional view of a semiconductor device package in accordance with some embodiments of the present disclosure.

FIG. 5 illustrates a cross-sectional view of a semiconductor device package 5 in accordance with some embodiments of the present disclosure. The semiconductor device package 5 is similar to the semiconductor device package 1 in FIG. 1A except for the differences described below.

An end of the conductive pillar 12 may be electrically connected to a RDL 51 and another end of the conductive pillar 12 may be electrically connected to a RDL 52. The RDL 51 and the RDL 52 may be proximal to opposite sides of substrate 10. The RDL 51 and the RDL 52 may be over opposite sides of substrate 10, respectively. For example, the RDL 51 may be over the surface 101 of the substrate 10 and the RDL 52 may be over the surface 102 of the substrate 10. In some embodiments, the RDL 52 may be connected with the conductive wire 13w. In some embodiments, the RDL 51 may be connected with the electrical contact 16. Another dielectric layer (not shown for conciseness) may be added to protect RDL 52 while leaving the conductive pad 13 open or exposed for adding or forming the conductive wire 13w (or a solder ball, or another connector).

FIG. 6A, FIG. 6B, FIG. 6C, FIG. 6D, FIG. 6E, FIG. 6F, and FIG. 6G illustrate one or more stages of a method of manufacturing a semiconductor device package in accordance with some embodiments of the present disclosure. At least some of these figures have been simplified for a better understanding of the aspects of the present disclosure.

Figure 6A:
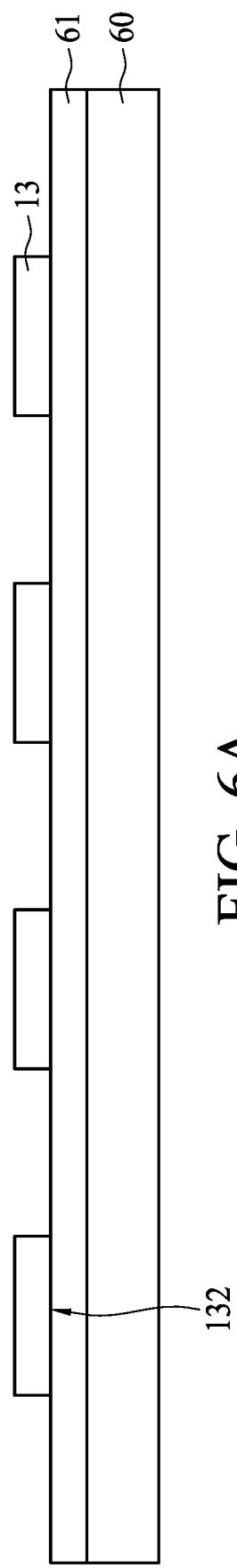
FIG. 6A, FIG. 6B, FIG. 6C, FIG. 6D, FIG. 6E, FIG. 6F, and FIG. 6G illustrate one or more stages of a method of manufacturing a semiconductor device package in accordance with some embodiments of the present disclosure.

Referring to FIG. 6A, a temporary carrier 60 may be provided. The temporary carrier 60 may include a conductive core layer with conductive layers (such as a foil layer 61) provided on one side or both sides. In some embodiments, the foil layer 61 may include, for example, titanium (Ti), Cu, Ni, another metal, or an alloy (such as a titanium-tungsten alloy (TiW)).

A conductive pad 13 may be provided on the foil layer 61. The conductive pad 13 may be patterned by, for example, lithographic technique, to expose a portion of the foil layer 61. The surface 132 of the conductive pad 13 may directly contact the foil layer 61.

Figure 6B:
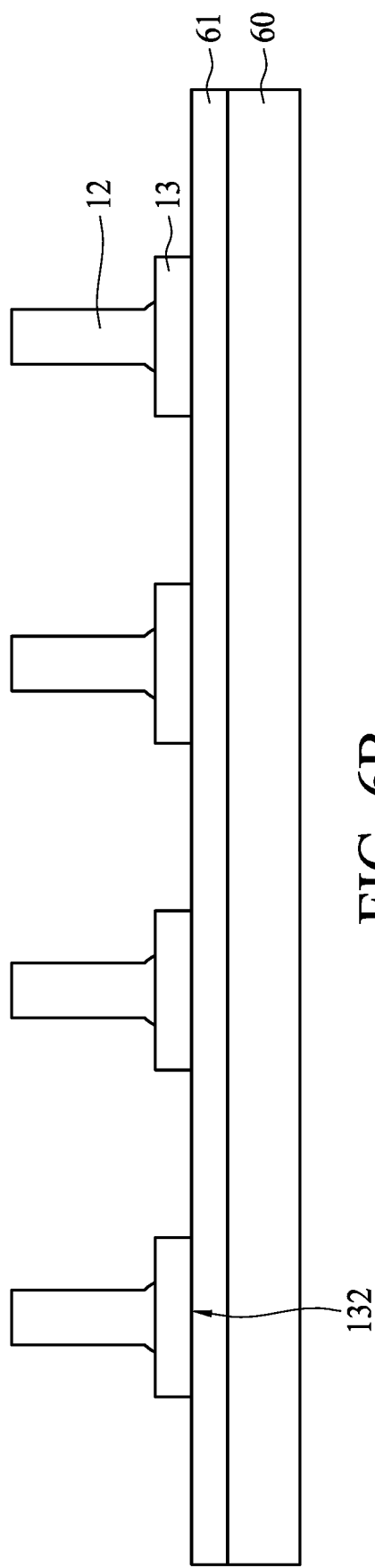

Referring to FIG. 6B, a conductive pillar 12 may be formed on the conductive pad 13. In some embodiments, for examples, the conductive pillar 12 may be formed by plating or wedge bonding. In some embodiments, the conductive pillar 12 may include a pillar with substantially vertical sidewall profile or a stud bump having a convex bulge profile at the end proximal to the conductive pad 13.

Figure 6C:
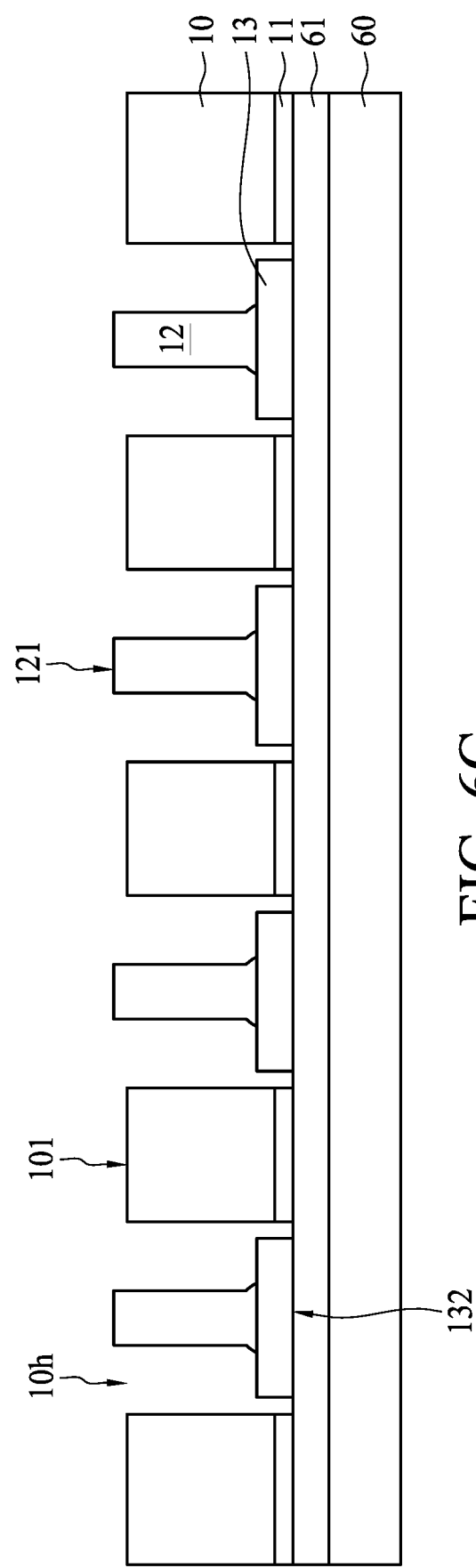

Referring to FIG. 6C, a substrate 10 may be attached to the temporary carrier 60 through a dielectric layer 11. In some embodiments, the dielectric layer 11 may include polyimide previously coated on the surface 102 of the substrate 10, pre-cured, and brought into contact with the foil layer 61. A post-cure operation may be performed to solidify the dielectric layer 11 and secure the bonding between the substrate 10 and the temporary carrier 60.

The substrate 10 and the dielectric layer 11 may have one or more through openings 10h. The conductive pillar 12 may be disposed in the through opening 10*h*. The conductive pillars 12 may be aligned with the through opening 10*h*. A gap may exist between one of the conductive pillars 12 and the sidewall of one of the through openings. In some embodiments, the top surface 121 of the conductive pillars 12 may exceed the surface 101 of the substrate 10. Note in FIG. 6C, the conductive pillar 12 is a tall pillar where a top surface of the conductive pillar 12 being higher than the surface 101 of the substrate 10.

In some embodiments, an electronic component (such as the conductive pad 20 in FIG. 2 and the electrical connector 40 in FIG. 4) may be provided on the surface 101 (which may be an active surface or may include an active region underneath) of the substrate 10. In some embodiments, an active region may be formed on the surface 101 of the substrate 10. In some embodiments, for example, in a drilling last process, the active region may be formed in the substrate 10 before the through hole 10*h* being formed by laser drilling operations. The substrate 10 (e.g., silicon wafer) with active region and through holes 10*h* can then be aligned and attached to the temporary carrier 60 with pre-formed conductive pillars 12. In some embodiments, for example, in a drilling first process, the active region may be formed in the substrate 10 after the through hole 10*h* being formed by laser drilling operations. The substrate 10 (e.g., silicon wafer) with through holes 10*h* can be aligned and attached to the temporary carrier 60 with pre-formed conductive pillars 12, followed by forming the active region at the surface 101 of the substrate 10. The drilling first process may provide a better planarity since the substrate 10 (e.g., silicon wafer) is ground to a desired thickness before performing the laser drilling operations. No further grinding operation is required to bond the substrate 10 to the temporary carrier 60. Furthermore, the active region formed after the laser drilling operation better protects the integrity of the active regions.

In some embodiments, the conductive pad 20 may be formed on the surface 101 of the substrate 10, then the through opening may be formed to bypass the conductive pad 20. For example, the through opening 10*h* may be formed around the conductive pad 20. In some other embodiments, the conductive pad 20 may be formed after the through opening 10*h* is formed in the substrate 10.

Figure 6D:
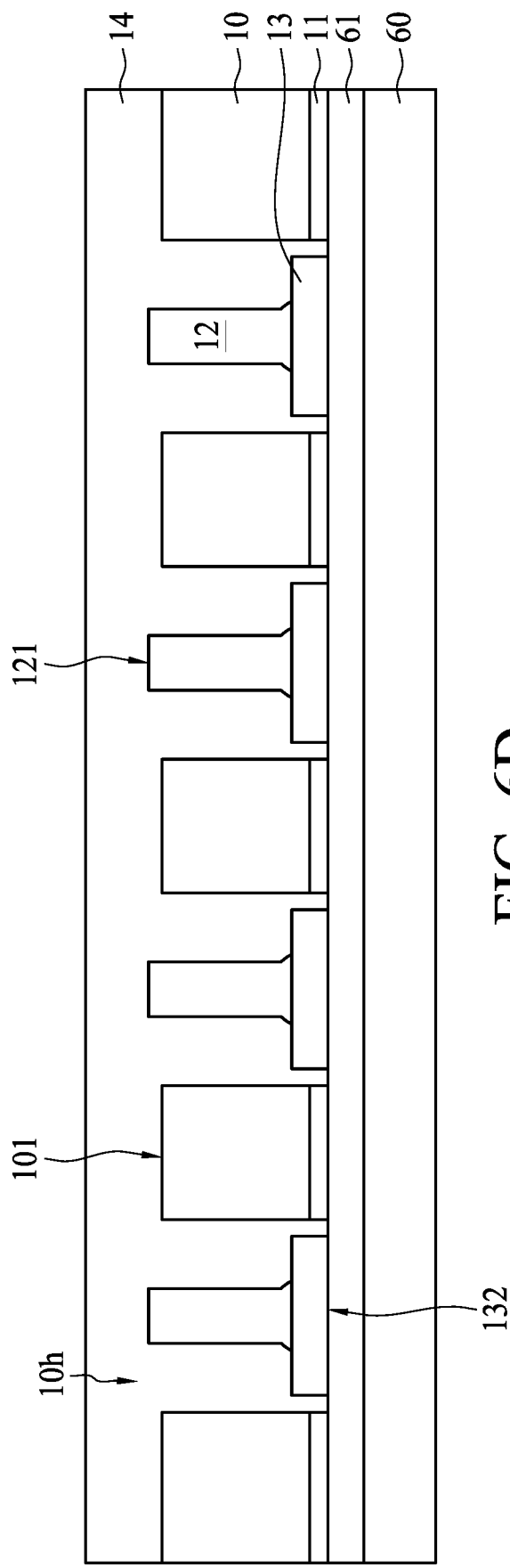

Referring to FIG. 6D, a dielectric layer 14 may be formed on the surface 101 of the substrate 10 and the surface 121 of the conductive pillar 12. In some embodiments, the dielectric layer 14 may be formed by, for example, coating, lamination or other suitable processes. In some embodiments, the dielectric layer 14 may cover the surface 101 of the substrate 10 and the surface 121 of the conductive pillar 12. In some embodiments, the dielectric layer 14 may fill up the remaining space of the through opening 10*h* of the substrate 10. In some embodiments, the dielectric layer 14 may be polyimide.

Figure 6E:
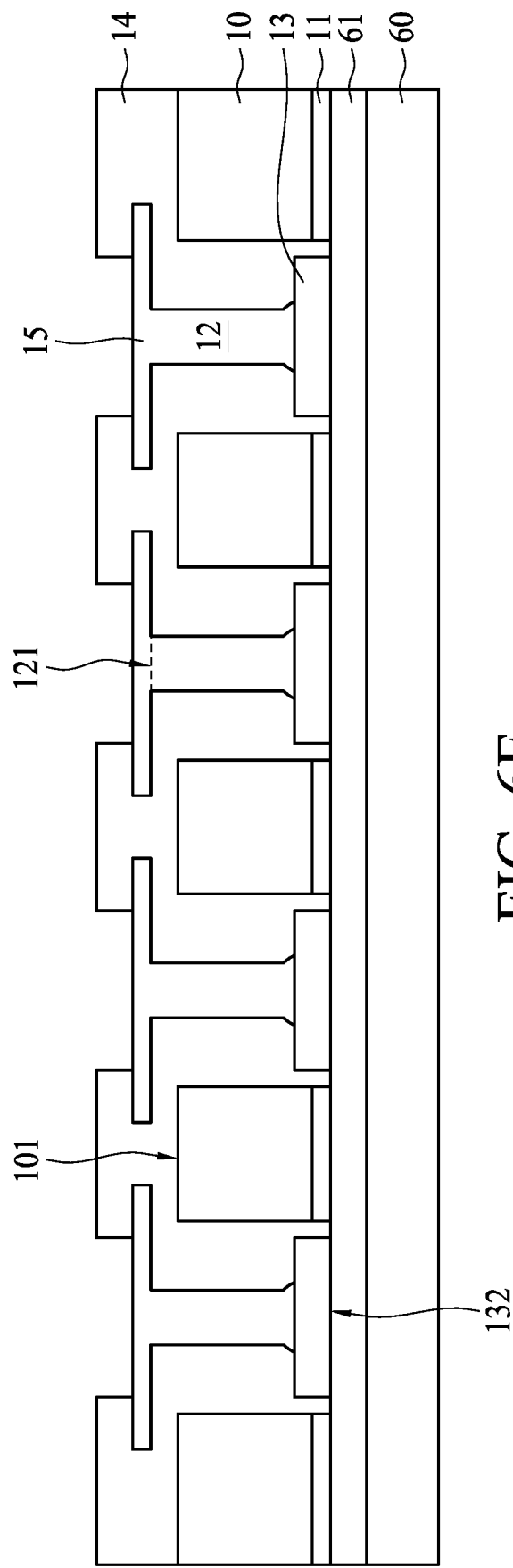

Referring to FIG. 6E, a RDL 15 may be formed on the conductive pillar 12 and electrically connected to the conductive pillar 12. A portion of the dielectric layer 14 may be removed (e.g., ground) to expose a top surface of the conductive pillar 12, followed by dielectric layer patterning and conductive lines plating to form the RDL 15.

In some embodiments, a via 15*v* and a pad 15*p* as shown in FIG. 1B may be formed on the top surface of the conductive pillar 12. The RDL 15 may be electrically connected to the conductive pillar 12 through the via 15*v* and the pad 15*p*.

In some embodiments, the dielectric layer 14 may be formed on the RDL 15 by, for example, coating, lamination or other suitable processes. The dielectric layer 14 may cover the RDL 15. In some embodiments, a planarization operation, a grinding operation, or another suitable removal operation may be applied to the dielectric layer 14 so as to expose the conductive pillar 12 and the RDL 15. In some embodiments, the substrate 10 may be protected from the removal operation since the removal will be stopped at the top surface 121 of the conductive pillars 12, which in the case of tall pillar exceeds the surface 101 of the substrate 10.

Figure 6F:
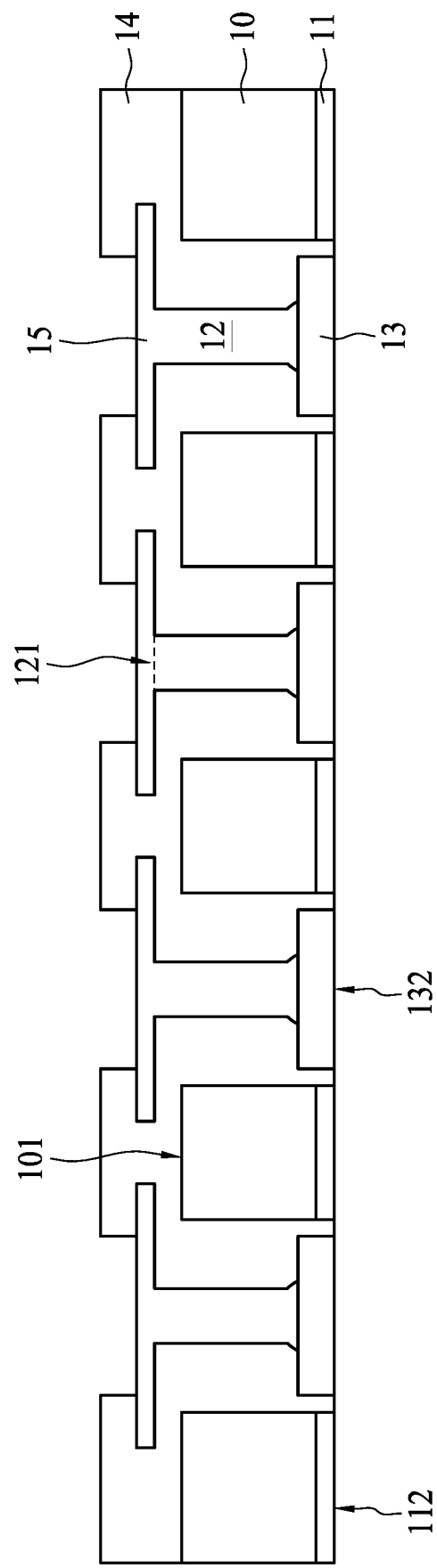

Referring to FIG. 6F, the temporary carrier 60 and the foil layer 61 may be removed by an etching operation or other suitable processes. The etching operation implements an etchant that consumes the material of the foil layer 61 faster than the material of the conductive pad 13. Alternatively stated, the conductive pad 13 serves the purpose of an etch stop for the foil layer 61 during the etching operation set forth. After the etching operation, the surface 132 of the conductive pad 13 may be exposed. The surface 132 of the conductive pad 13 may be substantially coplanar with the surface 112 of the dielectric layer 11. The surface 132 of the conductive pad 13 may be a leveled surface.

Figure 6G:
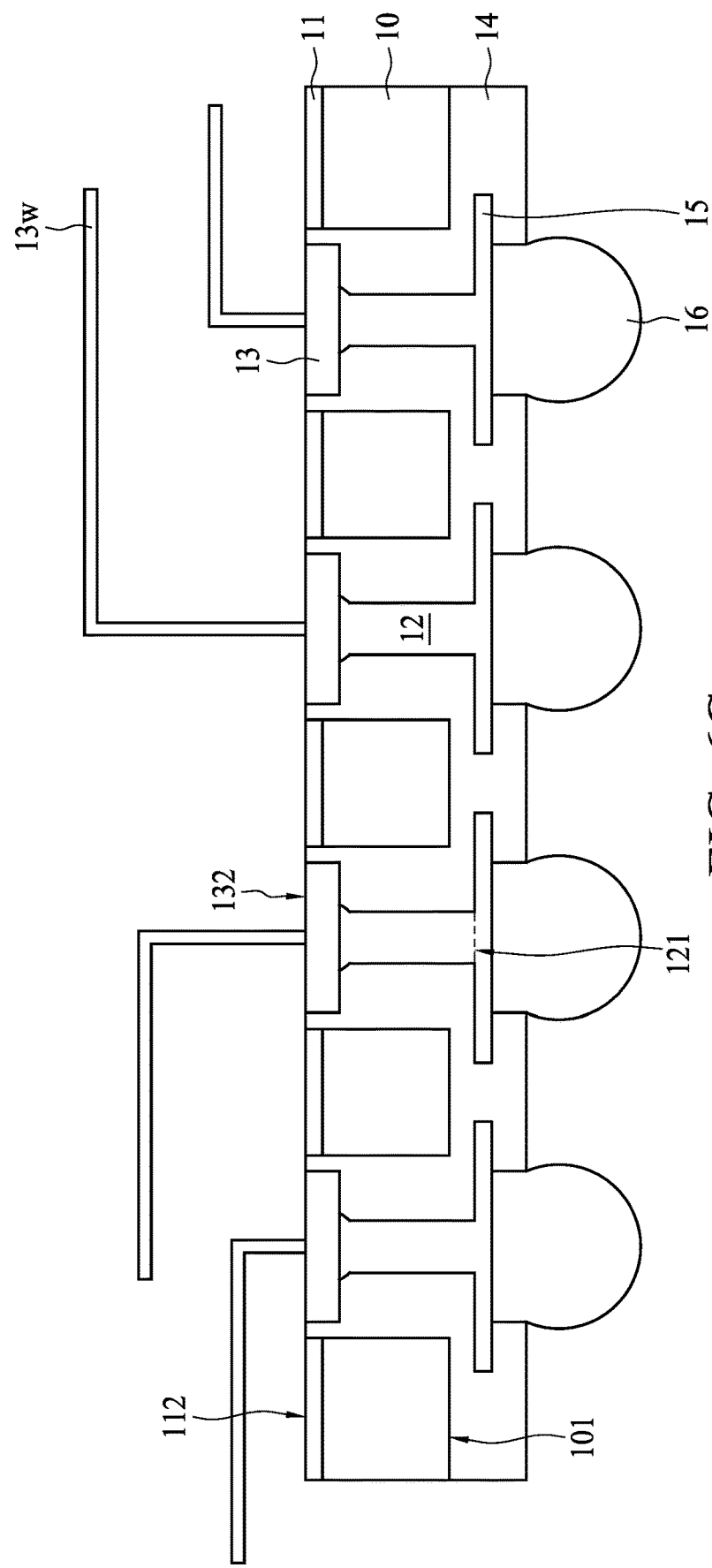

Referring to FIG. 6G, the structure obtained in the operation of FIG. 6F is flipped. A wire bonding operation may be performed on the surface 132 of the conductive pad 13 to form the conductive wire 13*w*. An electrical contact 16 may be provided on an expose surface of the RDL 15. The structure manufactured through the operations illustrated in FIG. 6A, FIG. 6B, FIG. 6C, FIG. 6D, FIG. 6E, FIG. 6F, and FIG. 6G may be similar to the semiconductor device package 1 in FIG. 1A.

Figure 7A:
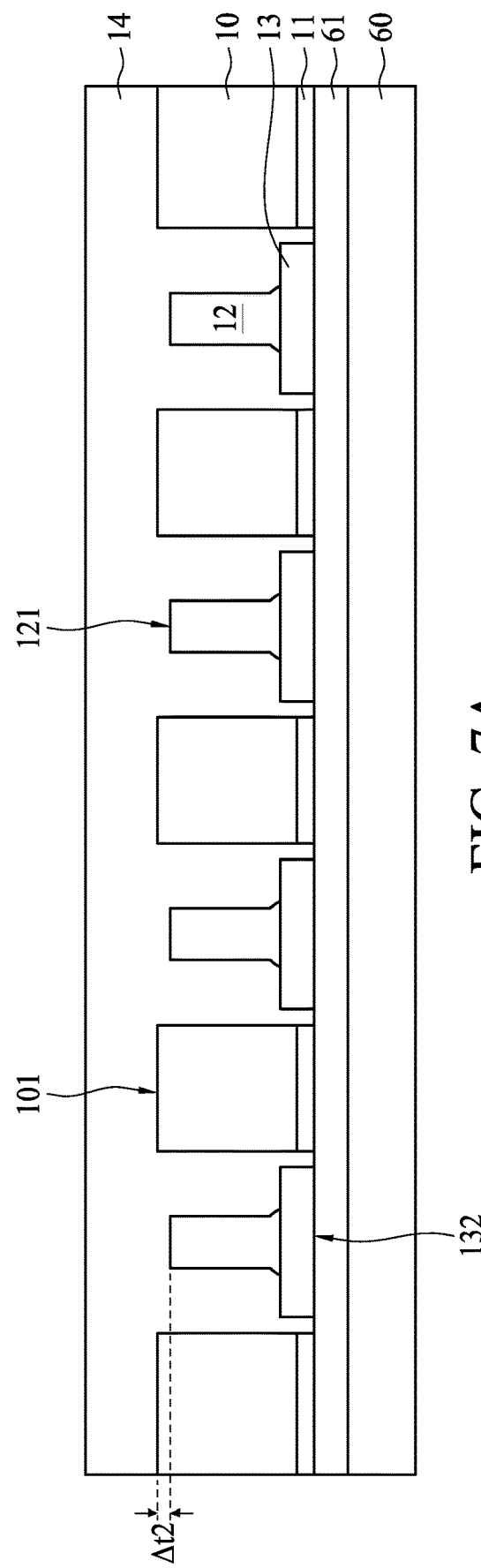
FIG. 7A, FIG. 7B and FIG. 7C illustrate one or more stages of a method of manufacturing a semiconductor device package in accordance with some embodiments of the present disclosure.
Figure 7B:
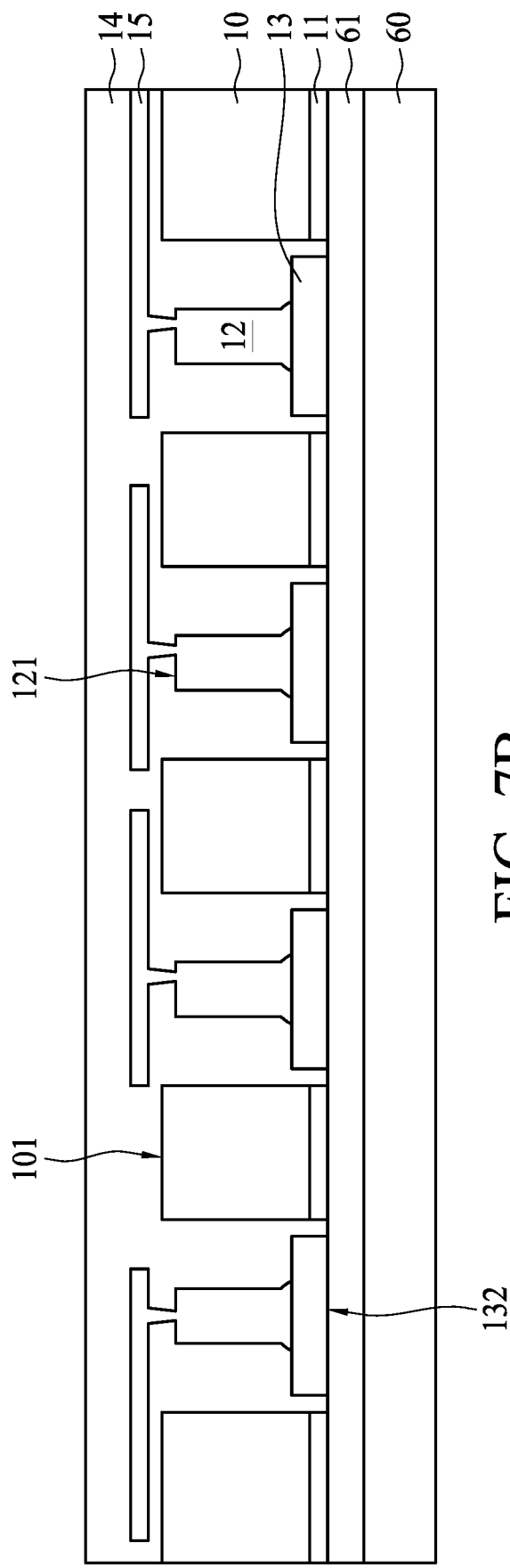
Figure 7C:
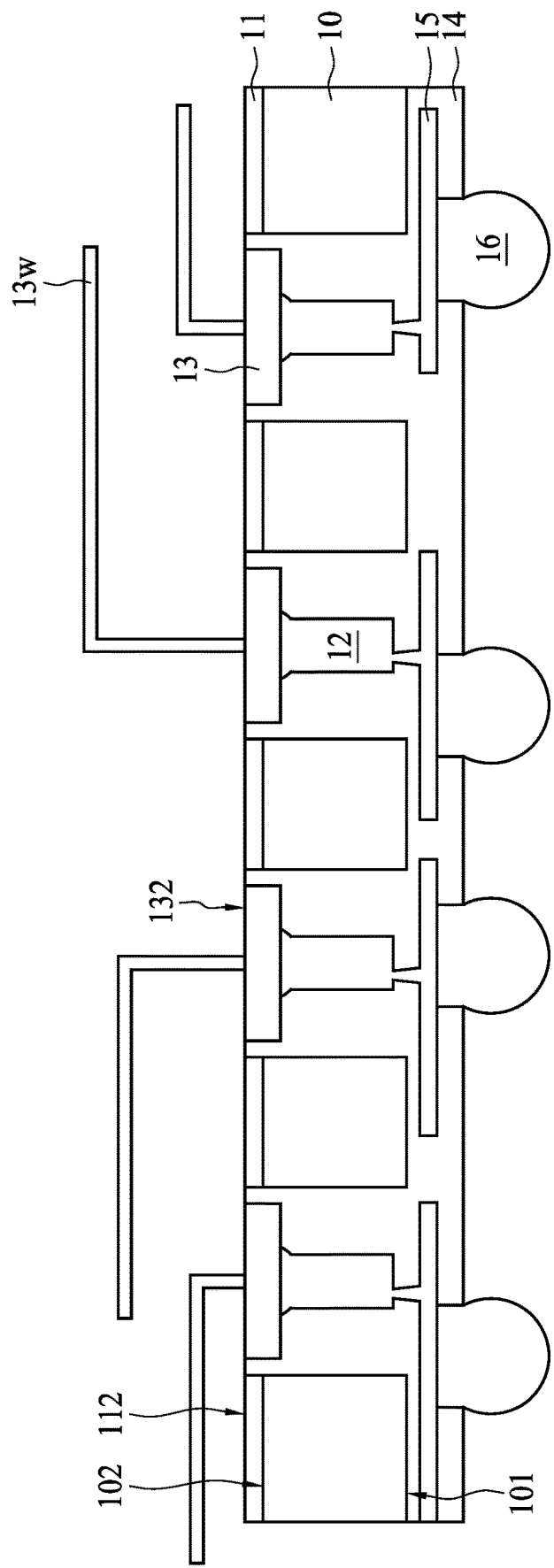

FIG. 7A, FIG. 7B and FIG. 7C illustrate one or more stages of a method of manufacturing a semiconductor device package in accordance with some embodiments of the present disclosure.

In some embodiments, the operation of FIG. 7A may be subsequent to the operation of FIG. 6C. The operation of FIG. 7A may be similar to the operation of FIG. 6D except that a surface of the conductive pillar 12 is lower than the surface 101 of the substrate 10 by a gap Δ t2, in which a short pillar is used compared to the tall pillar previously shown in FIG. 6C. In some embodiments, since the conductive pillar 12 does not exceed the surface 101 of the substrate 10, it is easier to fill up the dielectric layer 14 in the through opening of the substrate 10.

Referring to FIG. 7B, a RDL 15 may be formed over the surface 101 of the substrate 10 to electrically connect to the conductive pillar 12. A portion of the dielectric layer 14 may be removed (e.g., ground) to expose the surface 101 of the substrate 10. Subsequently, via holes are formed, for example, by laser drilling operation, over the top surface 121 of the conductive pillar 12, and followed by conductive via plating. In some embodiments, a via 15*v* and a pad 15*p* as shown in FIG. 1B may be formed on the top surface 121 of the conductive pillar 12. Dielectric layer patterning and conductive lines plating are later performed to form the RDL 15. The RDL 15 may be electrically connected to the conductive pillar 12 through the via 15*v* and the pad 15*p*.

Referring to FIG. 7C, the structure obtained in the operation of FIG. 7B is flipped. A wire bonding operation may be performed on surface 132 of the the conductive pad 13 to form the conductive wire 13*w*. An electrical contact 16 may be provided on an expose surface of the RDL 15. Another dielectric layer (not shown for conciseness) may be added to protect RDL 52 while leaving the conductive pad 13 open or exposed for adding or forming the conductive wire 13*w* (or a solder ball, or another connector). The structure manufactured through the operations illustrated in FIG. 7A, FIG. 7B and FIG. 7C may be similar to the semiconductor device package 3 in FIG. 3.

FIG. 8A, FIG. 8B, FIG. 8C, FIG. 8D, FIG. 8E, FIG. 8F, and FIG. 8G illustrate one or more stages of a method of manufacturing a semiconductor device package in accordance with some embodiments of the present disclosure. At least some of these figures have been simplified for a better understanding of the aspects of the present disclosure.

Figure 8A:
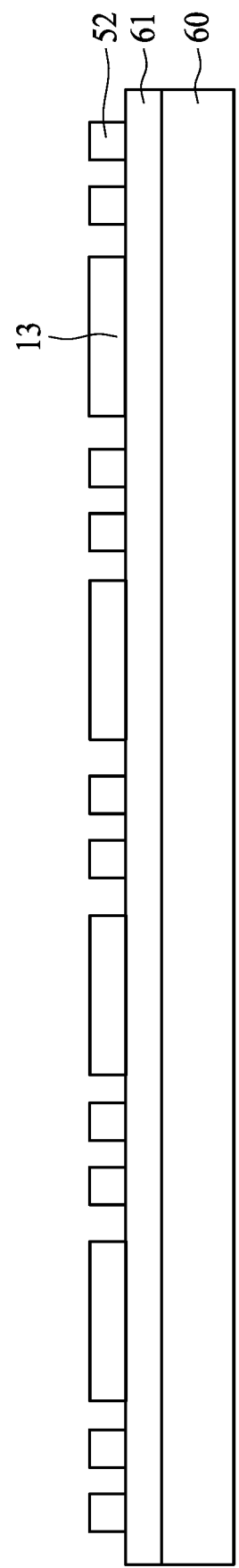
FIG. 8A, FIG. 8B, FIG. 8C, FIG. 8D, FIG. 8E, FIG. 8F, and FIG. 8G illustrate one or more stages of a method of manufacturing a semiconductor device package in accordance with some embodiments of the present disclosure.

The operation of FIG. 8A may be similar to the operation of FIG. 6A except that a RDL 52 may be formed on the foil layer 61. In some embodiments, the RDL 52 and the conductive pad 13 may be disposed on the same layer. In some embodiments, the RDL 52 and the conductive pad 13 may be formed in different operations. For example, the RDL 52 may be formed after the formation of the conductive pad 13.

Figure 8B:
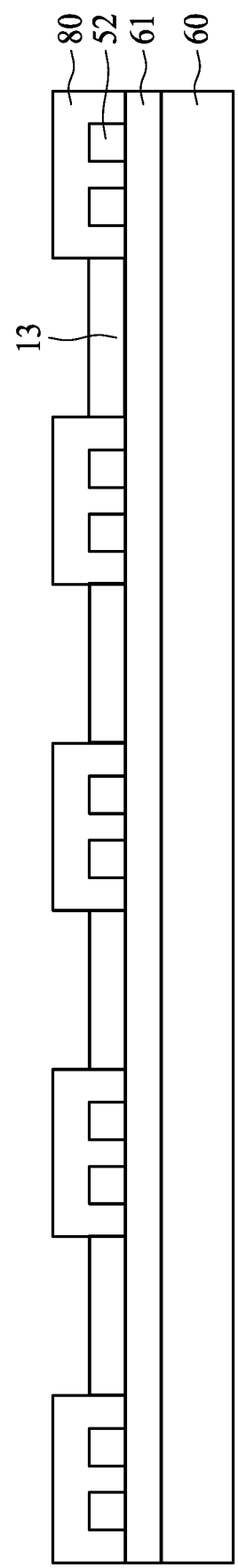

Referring to FIG. 8B, a dielectric layer 80 may be formed to cover the conductive pad 13 and the RDL 52. The dielectric layer 80 may be patterned to expose a portion of the conductive pad 13.

Figure 8C:
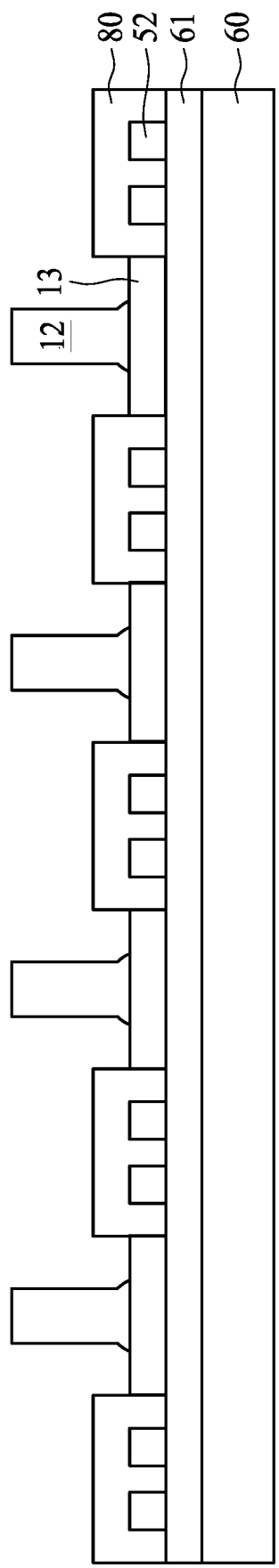

Referring to FIG. 8C, a conductive pillar 12 may be formed on the conductive pad 13. In some embodiments, for examples, the conductive pillar 12 may be formed by plating or wedge bonding. In some embodiments, the conductive pillar 12 may include a pillar with substantially vertical sidewall profile or a stud bump having a convex bulge profile at the end proximal to the conductive pad 13.

Figure 8D:
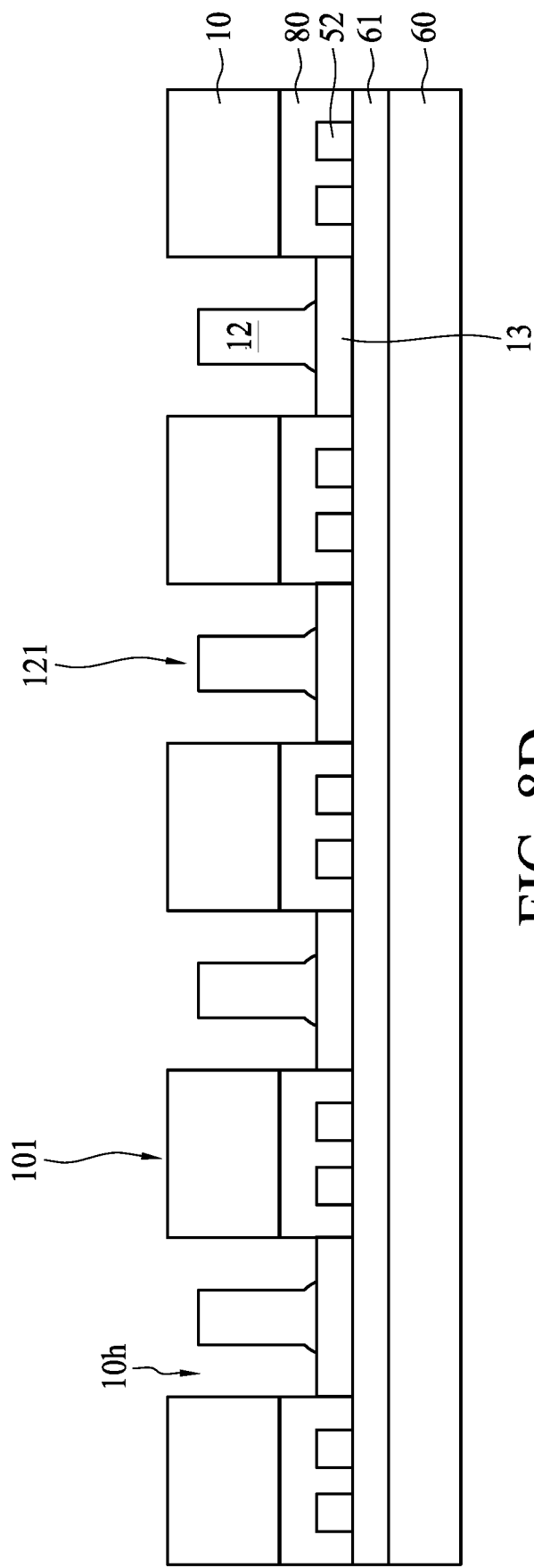

Referring to FIG. 8D, a substrate 10 may be attached to the temporary carrier 60 through the dielectric layer 80. The conductive pillar 12 may be disposed in the through opening 10h of the substrate 10. In some embodiments, the conductive pillar 12 may be a tall pillar where a top surface 121 of the conductive pillar 12 being higher than the surface 101 of the substrate 10. In some embodiments, the conductive pillar 12 may be a short pillar where a top surface 121 of the conductive pillar 12 being lower than the surface 101 of the substrate 10.

Figure 8E:
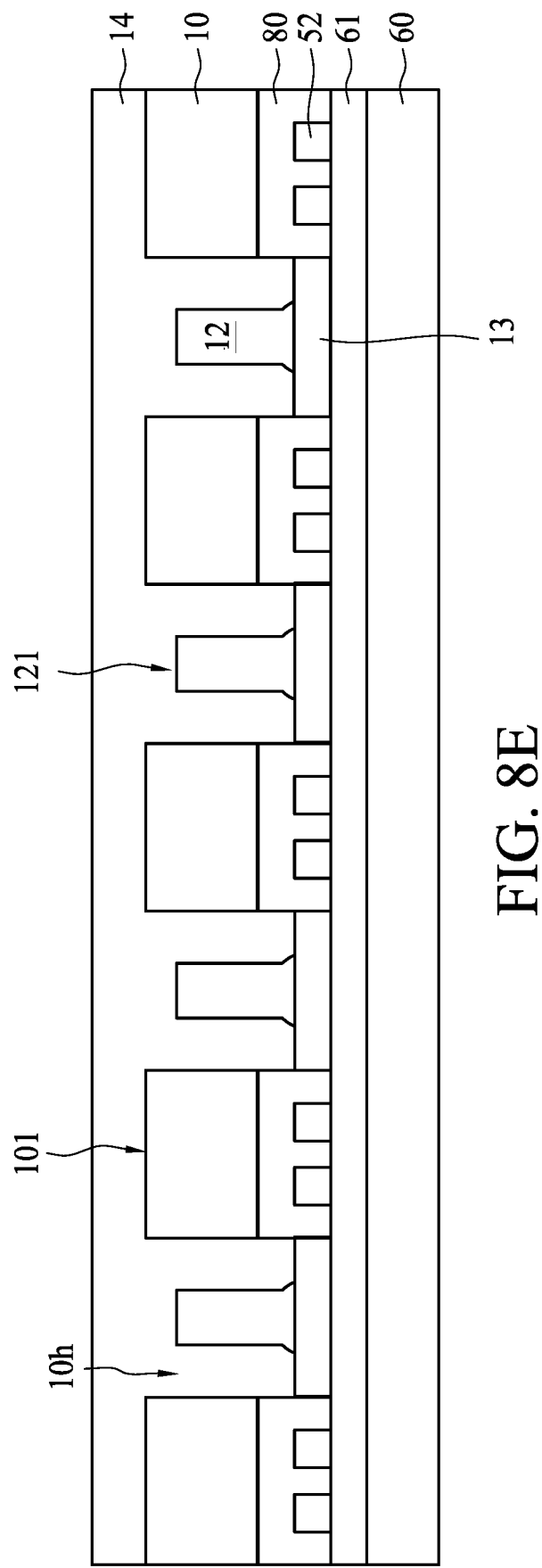

Referring to FIG. 8E, a dielectric layer 14 may be formed on the surface 101 of the substrate 10 and the surface 121 of the conductive pillar 12. In some embodiments, the dielectric layer 14 may be formed by, for example, coating, lamination or other suitable processes. In some embodiments, the dielectric layer 14 may cover the surface 101 of the substrate 10 and the surface 121 of the conductive pillar 12. In some embodiments, the dielectric layer 14 may fill up the remaining space of the through opening 10h of the substrate 10. In some embodiments, the dielectric layer 14 may be polyimide.

Figure 8F:
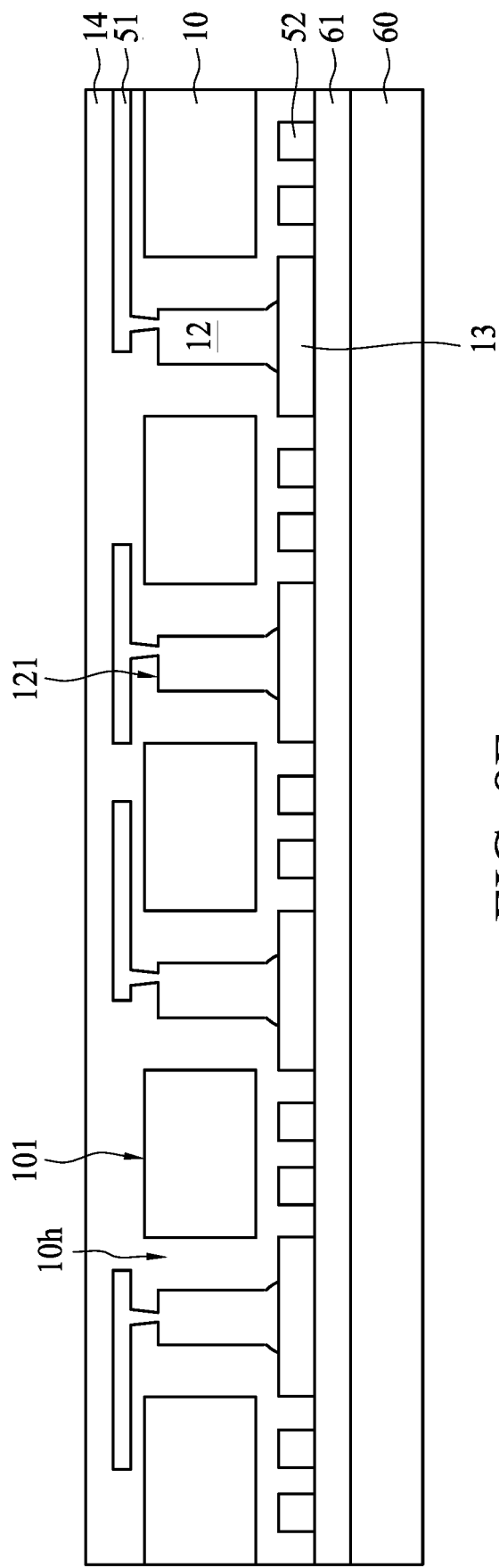

Referring to FIG. 8F, a RDL 51 may be formed on the conductive pillar 12 and electrically connected to the conductive pillar 12. A portion of the dielectric layer 14 may be removed (e.g., ground) to expose a top surface of the conductive pillar 12, followed by dielectric layer patterning and conductive lines plating to form the RDL 51. The dielectric layer 80 is not illustrated in the FIG. 8F and the following figures for conciseness.

Figure 8G:
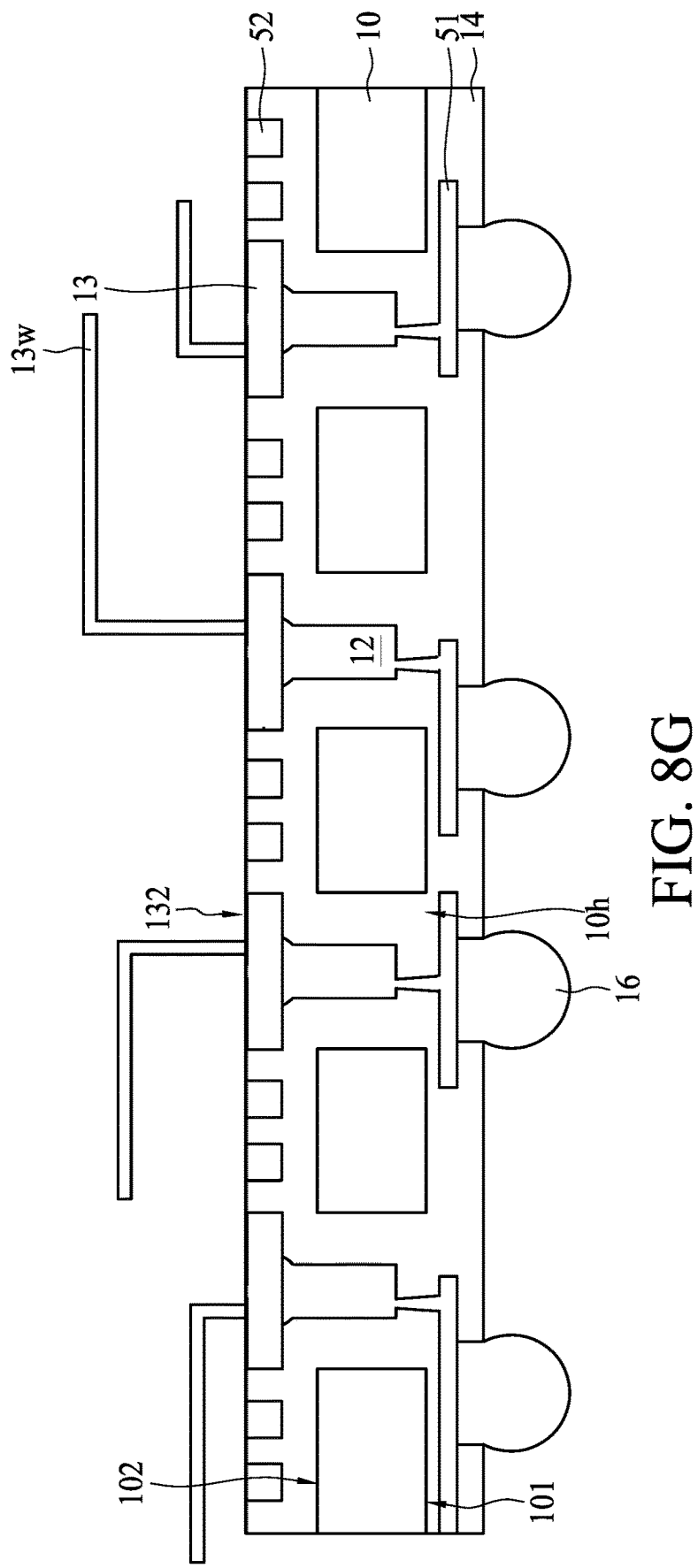

Referring to FIG. 8G, the temporary carrier 60 and the foil layer 61 may be removed by an etching operation or other suitable processes. The etching operation implements an etchant that consumes the material of the foil layer 61 faster than the material of the conductive pad 13. Alternatively stated, the conductive pad 13 serves the purpose of an etch stop for the foil layer 61 during the etching operation set forth. After the etching operation, the surface 132 of the conductive pad 13 may be exposed. In some embodiments, a surface of the RDL 52 may be exposed after the etching operation.

A wire bonding operation may be performed on the surface 132 of the conductive pad 13 to form the conductive wire 13w. An electrical contact 16 may be provided on an expose surface of the RDL 51. The structure manufactured through the operations illustrated in FIG. 8A, FIG. 8B, FIG. 8C, FIG. 8D, FIG. 8E, FIG. 8F, and FIG. 8G may be similar to the semiconductor device package 5 in FIG. 5.

Spatially relative terms, such as "beneath," "below," "lower," "above," "upper," "left," "right" and the like, may be used herein for ease of description to describe one element or feature's relationship to another element(s) or feature(s) as illustrated in the figures. The spatially relative terms are intended to encompass different orientations of the device in use or operation, in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately," "substantially," "substantial," and "about" are used to describe and account for small variations. When used in conduction with an event or circumstance, the terms can refer to instances in which the event or circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints unless specified otherwise. The term "substantially coplanar" can refer to two surfaces within micrometers (μm) of lying along the same plane, such as within 10 μm, within 5 μm, within 1 μm, or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device package, comprising:
a substrate having a first surface and a second surface opposite to the first surface of the substrate, the substrate having a through opening extending between the first surface of the substrate and the second surface of the substrate;
a first conductive pad in the through opening and approximal to the second surface of the substrate, the first conductive pad having a first surface and a second surface opposite to the first surface of the first conductive pad, and a conductive pillar in contact with the first surface of the first conductive pad, wherein the second surface of the first conductive pad protrudes from the second surface of the substrate,
wherein a width of the through opening is substantially constant from the first surface of the substrate to the second surface of the substrate.

2. The semiconductor device package of claim 1, wherein the conductive pillar includes a stud bump.

3. The semiconductor device package of claim 1, wherein the conductive pillar includes a portion protruding from a lateral surface of the conductive pillar in a cross-sectional view.

4. The semiconductor device package of claim 1, wherein the portion has a curved surface connecting the first surface of the first conductive pad in the cross-sectional view.

5. The semiconductor device package of claim 1, wherein a gap between the substrate and the conductive pillar is greater than a gap between the substrate and the first conductive pad.

6. The semiconductor device package of claim 1, wherein the first conductive pad is not vertically overlapped with the substrate in a cross-sectional view.

7. The semiconductor device package of claim 1, further comprising:
a first dielectric layer disposed over the first surface of the substrate and partially within the through opening.

8. The semiconductor device package of claim 7, further comprising a second dielectric layer disposed over the second surface of the substrate, wherein the second surface of the first conductive pad, a surface of the first dielectric layer, and a surface of the second dielectric layer are substantially aligned.

9. The semiconductor device package of claim 8, wherein the surface of the second dielectric layer is exposed to air.

10. A semiconductor device package, comprising:
a carrier body having a first surface and a second surface opposite to the first surface of the carrier body, the carrier body having a first through opening extending between the first surface of the carrier body and the second surface of the carrier body;
a first conductive pillar in the first through opening of the carrier body; and
a first conductive pad within the first through opening of the carrier body and in contact with the first conductive pillar, wherein the first conductive pillar is composed of a material different from that of the first conductive pad and the first conductive pad is a first etch protection layer to the first conductive pillar,
wherein the first conductive pad is connected to a connector configured to connect the semiconductor device package to an external device.

11. The semiconductor device package of claim 10, further comprising:
a conductive via disposed under the first conductive pillar and tapers toward the first conductive pillar.

12. The semiconductor device package of claim 11, wherein a portion of the conductive via is disposed within the first through opening.

13. The semiconductor device package of claim 10, further comprising:
a second conductive pad disposed between the conductive via and the first conductive pillar, wherein a width of the second conductive pad is smaller than a width of the first conductive pillar and greater than a width of the conductive via.

14. The semiconductor device package of claim 10, further comprising:
a third conductive pad disposed under the first surface of the carrier body; and
a redistribution layer connecting the first conductive pillar with the third conductive pad.

15. The semiconductor device package of claim 14, wherein the first through opening is around the third conductive pad.

16. The semiconductor device package of claim 10, wherein an elevation of a lower surface of the first conductive pillar is higher than an elevation of the first surface of the carrier body with respect to the first conductive pad.

17. The semiconductor device package of claim 10, further comprising:
an electronic component disposed over the carrier body and electrically connected to the first conductive pad;
a second conductive pillar in a second through opening of the carrier body; and
a second conductive pad within the second through opening of the carrier body and in contact with the second conductive pillar, wherein the second conductive pillar is composed of a material different from that of the second conductive pad and the second conductive pad is a second etch protection layer to the second conductive pillar; and
a conductive wire disposed over the carrier body and electrically connected to the second conductive pad.

18. The semiconductor device package of claim 10, further comprising:
a third conductive pillar in a third through opening of the carrier body;
a third conductive pad within the third through opening of the carrier body and in contact with the third conductive pillar, wherein the third conductive pillar is composed of a material different from that of the third conductive pad and the third conductive pad is a third etch protection layer to the third conductive pillar; and
a first conductive wire disposed over the carrier body and electrically connected to the first conductive pad; and
a second conductive wire disposed over the carrier body and electrically connected to the third conductive pad,
wherein a top end of the first conductive wire and a top end of the second conductive wire are at different elevations with respect to the carrier body.

19. The semiconductor device package of claim 18, wherein the second conductive wire is closer to a lateral side of the carrier body than the first conductive wire.

20. The semiconductor device package of claim 10, further comprising:
a redistribution layer disposed over the carrier body, wherein an upper surface of the redistribution layer is substantially level with an upper surface of the first conductive pad.

* * * * *